United States Patent
Nomura et al.

(10) Patent No.: US 10,153,267 B2
(45) Date of Patent: Dec. 11, 2018

(54) ESD-PROTECTIVE-FUNCTION-EQUIPPED COMPOSITE ELECTRONIC COMPONENT

(71) Applicant: Murata Manufacturing Co., Ltd., Nagaokakyo-shi, Kyoto-fu (JP)

(72) Inventors: Masanobu Nomura, Nagaokakyo (JP); Yutaka Takeshima, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 39 days.

(21) Appl. No.: 15/403,356

(22) Filed: Jan. 11, 2017

(65) Prior Publication Data

US 2017/0125398 A1 May 4, 2017

Related U.S. Application Data

(63) Continuation of application No. PCT/JP2015/070757, filed on Jul. 22, 2015.

(30) Foreign Application Priority Data

Jul. 23, 2014 (JP) ................. 2014-149598

(51) Int. Cl.
| | |
|---|---|
| *H01L 27/02* | (2006.01) |
| *H01L 29/866* | (2006.01) |
| *H01L 27/01* | (2006.01) |
| *H01L 27/13* | (2006.01) |

(Continued)

(52) U.S. Cl.
CPC ........ *H01L 27/0248* (2013.01); *H01L 27/016* (2013.01); *H01L 27/0255* (2013.01); *H01L 27/13* (2013.01); *H01L 29/866* (2013.01); *H01L 28/10* (2013.01); *H01L 28/20* (2013.01); *H01L 28/40* (2013.01); *H01L 29/1604* (2013.01)

(58) Field of Classification Search
None
See application file for complete search history.

(56) References Cited

U.S. PATENT DOCUMENTS

| | | | |
|---|---|---|---|
| 6,147,853 | A | 11/2000 | Berthiot |
| 6,304,126 | B1 | 10/2001 | Berthiot |
| 6,414,369 | B1 | 7/2002 | Battersby et al. |

(Continued)

FOREIGN PATENT DOCUMENTS

| | | |
|---|---|---|
| JP | S61-206269 A | 9/1986 |
| JP | H11-168175 A | 6/1999 |

(Continued)

OTHER PUBLICATIONS

International Search Report issued for PCT/JP2015/070757, dated Sep. 1, 2015.

(Continued)

*Primary Examiner* — Daniel Whalen
(74) *Attorney, Agent, or Firm* — Arent Fox LLP

(57) ABSTRACT

An ESD-protective-function-equipped composite electronic component is provided that includes multiple Zener diodes formed from first and second semiconductor layers. Moreover, the second semiconductor layers are disposed on an insulating substrate and in the same plane. The electronic component includes electrodes extending from each of the Zener diodes and one or more thin-film circuit element connected in series between a pair of the electrodes.

20 Claims, 12 Drawing Sheets

(51) Int. Cl.
    *H01L 49/02*         (2006.01)
    *H01L 29/16*         (2006.01)

(56)               References Cited

U.S. PATENT DOCUMENTS

| | | |
|---|---|---|
| 2003/0031063 A1 | 2/2003 | Amachi et al. |
| 2006/0038635 A1 | 2/2006 | Richiuso et al. |
| 2006/0290625 A1 | 12/2006 | Sugimoto |
| 2010/0060349 A1* | 3/2010 | Etter .................. H01L 27/0255 |
| | | 327/552 |
| 2014/0070367 A1 | 3/2014 | Kawase et al. |

FOREIGN PATENT DOCUMENTS

| | | |
|---|---|---|
| JP | 2002-541681 A | 12/2002 |
| JP | 2003-060046 A | 2/2003 |
| JP | 2007-005616 A | 1/2007 |
| JP | 2009-124410 A | 6/2009 |
| JP | 2013-065771 A | 4/2013 |
| JP | 2014-067986 A | 4/2014 |
| WO | WO 2006/023655 A2 | 3/2006 |

OTHER PUBLICATIONS

Written Opinion of the International Searching Authority issued for International Application No. PCT/JP2015/070757, dated Sep. 1, 2015.

\* cited by examiner

PRIOR ART

ESD-PROTECTIVE-FUNCTION-EQUIPPED COMPOSITE ELECTRONIC COMPONENT

CROSS REFERENCE TO RELATED APPLICATIONS

The present application is a continuation of PCT/JP2015/070757 filed Jul. 22, 2015, which claims priority to Japanese Patent Application No. 2014-149598, filed Jul. 23, 2014, the entire contents of each of which are incorporated herein by reference.

FIELD OF THE INVENTION

The present invention relates to an ESD-protective-function-equipped composite electronic component that has a protective function against an overvoltage caused by electrostatic discharge or the like.

BACKGROUND OF THE INVENTION

An conventional ESD-protective-function-equipped composite electronic component 500 illustrated in FIG. 12 and FIG. 13 includes a thin-film capacitor 505 that includes a first capacitor electrode layer 502 stacked on an insulating substrate 501, a dielectric layer 503 stacked on the first capacitor electrode layer 502, and a second capacitor electrode layer 504 stacked on the dielectric layer 503. In addition, the ESD-protective-function-equipped thin-film capacitor 500 includes a protection circuit 506 that is connected in parallel to the thin-film capacitor 505. It is noted that FIG. 12 is a plan view illustrating an ESD-protective-function-equipped composite electronic component of the related art, and FIG. 13 is a cross-sectional view taken along line A-A of FIG. 12.

The protection circuit 506 is formed of a plurality of (six) Schottky diodes 507a to 507f each having a thin-film structure, the Schottky diodes 507a to 507f being connected in series. For example, each of the Schottky diodes 507a to 507f included in the protection circuit 506 is formed in the following manner. That is to say, an electrode 508a is formed on a circumferential edge portion of the dielectric layer 503 so as to have a frame-like shape. The electrode 508a is connected to the first capacitor electrode layer 502 formed in a substantially rectangular shape.

As illustrated in FIG. 12, the second capacitor electrode layer 504 first formed in a substantially rectangular shape and then a lower right corner portion thereof with a substantially elongated rectangular shape has been cut away. Electrodes 508c and 508e each having a rectangular shape are formed on a portion of the dielectric layer 503, the portion being located at a position corresponding to the lower right corner portion of the second capacitor electrode layer 504, which has been cut away. A semiconductor layer 509 is formed on the dielectric layer 503 so as to partially coat the electrodes 508a, 508c, and 508e. When viewed in plan view, an electrode 508b is formed on the semiconductor layer 509 so as to be located between the electrode 508a and the electrode 508c, and an electrode 508d is formed on the semiconductor layer 509 so as to be located between the electrode 508c and the electrode 508e. The electrode 508f is formed on the semiconductor layer 509 so as to be located between the electrode 508e and the second capacitor electrode layer 504.

Accordingly, the Schottky diode 507a is formed of the electrodes 508a and 508b and the semiconductor layer 509. The Schottky diode 507b is formed of the electrodes 508b and 508c and the semiconductor layer 509. The Schottky diode 507c is formed of the electrodes 508c and 508d and the semiconductor layer 509. The Schottky diode 507d is formed of the electrodes 508d and 508e and the semiconductor layer 509. The Schottky diode 507e is formed of the electrodes 508e and 508f and the semiconductor layer 509. The Schottky diode 507f is formed of the electrode 508f, the second capacitor electrode layer 504, and the semiconductor layer 509. The protection circuit 506 is formed of the Schottky diodes 507a to 507f, which are connected in series. The electrode 508a of the Schottky diode 507a is connected to the first capacitor electrode layer 502, and as a result of one of the electrodes of the Schottky diode 507f being formed of the second capacitor electrode layer 504, the protection circuit 506 is connected in parallel to the thin-film capacitor 505.

In the ESD-protective-function-equipped composite electronic component 500, as described above, when an overvoltage caused by static electricity or the like is applied to the thin-film capacitor 505, the Schottky diodes 507a to 507f, which form the protection circuit 506, break down, and a current path is formed in the protection circuit 506. Thus, the thin-film capacitor 505 is protected as a result of an overcurrent flowing through the protection circuit 506. It is noted that each of the Schottky diodes 507a to 507f has a metal-semiconductor-metal structure and is formed so as to serve as an antiparallel Schottky diode in which the flow of current is limited by tunneling through a Schottky-junction metal-semiconductor Schottky barrier. The dielectric layer 503 is composed of stoichiometric silicon nitride ($Si_3N_4$), silicon dioxide ($SiO_2$), or the like. The semiconductor layer 509 is composed of silicon-rich non-stoichiometric silicon nitride, tantalum pentoxide ($Ta_2O_5$), or the like.

Patent Document 1: Japanese Unexamined Patent Application Publication (Translation of PCT Application) No. 2002-541681.

As described above, in the ESD-protective-function-equipped composite electronic component 500, the protection circuit 506 is formed by connecting in series the Schottky diodes 507a to 507f, each of which has a Schottky-junction metal-semiconductor-metal thin-film structure. Since the electrical barrier height of a Schottky barrier is theoretically about 2 eV or less, the voltage at which a current sharply increases is about 2 V or less. Consequently, in the case where the working voltage of the thin-film capacitor 505 is 2 V or more, if only one Schottky diode is connected in parallel to the thin-film capacitor 505, the current flows through the path on the Schottky diode side, and thus, the thin-film capacitor 505 cannot function.

Therefore, as described above, in the ESD-protective-function-equipped composite electronic component 500, the voltage value, at which the current increases, is increased by connecting in series the plurality of Schottky diodes 507a to 507f, so that the functions of the thin-film capacitor 505 are ensured. However, in this configuration, the number of the Schottky diodes 507a to 507f, which are connected in series, increases, and thus, there is a problem in that the element size of the ESD-protective-function-equipped composite electronic component 500 increases.

SUMMARY OF THE INVENTION

The present disclosure has been made in view of the above problems, and it is an object of the present disclosure to provide an ESD-protective-function-equipped composite electronic component in which a reduction in the element size thereof is achieved.

To achieve the above-described object, an ESD-protective-function-equipped composite electronic component is disclosed that includes a plurality of electrodes, a substrate, and a plurality of pn junction Zener diodes that are provided so as to correspond to the plurality of electrodes. Moreover, each of the plurality of pn junction Zener diodes includes a first semiconductor layer having a first conductivity type, which is one of p-type and n-type, and a second semiconductor layer having a second conductivity type, which is another one of p-type and n-type. Furthermore, at least one thin-film circuit element is provided that is connected in series between two of the electrodes among the plurality of outer electrodes. The first semiconductor layers is disposed on the second semiconductor layers, which is deposited on a main surface of the substrate. Each of the plurality of Zener diodes is connected to a corresponding one of the electrodes on the first semiconductor layer side of the Zener diode, and the second semiconductor layers of the plurality of Zener diodes are disposed on a common plane and are electrically connected to one another.

In the exemplary ESD-protective-function-equipped composite electronic component, each of the first semiconductor layers of the Zener diodes is connected to a corresponding one of the plurality of electrodes, and the second semiconductor layers of the plurality of Zener diodes are electrically connected to one another. Thus, a so-called bidirectional Zener diode, which is formed of two Zener diodes connected to each other in series in a reverse direction, is reliably inserted in series between the selected two outer electrodes among the plurality of outer electrodes (hereinafter sometimes referred to as between outer electrodes). Therefore, bidirectional Zener diodes can be inserted in series between all arbitrary outer electrodes by using a minimum number of Zener diodes.

Accordingly, at least one thin-film circuit element and a bidirectional Zener diode, each of which is connected in series between the two electrodes, are reliably connected in parallel to each other between the electrodes. In addition, between the two electrodes, in the case where one of the Zener diodes included in the bidirectional Zener diode breaks down due to, for example, an overvoltage caused by electrostatic discharge (ESD), the overvoltage is reliably applied to the other Zener diode in the forward direction. Consequently, in the case where one of the Zener diodes breaks down, a current path is reliably formed on the bidirectional Zener diode side, and thus, the at least one thin-film circuit element connected in series between the arbitrary outer electrodes can be protected against the overvoltage. Therefore, a current path for overvoltages of both positive and negative polarities is formed on the bidirectional Zener diode side, and thus, the at least one thin-film circuit element connected in series between the arbitrary outer electrodes can be protected with certainty against overvoltages of both positive and negative polarities.

In one exemplary aspect, a bidirectional Zener diode is formed of a pn junction Zener diode that includes a p-type semiconductor and an n-type semiconductor. A Zener diode can control the value of a breakdown voltage, at which a current sharply increases in a reverse voltage direction, by controlling the carrier concentration of a semiconductor. In a Zener diode, a breakdown voltage can be set to a significantly high value compared with the case of a Schottky diode. Thus, there is no need to connect in series a plurality of Zener diodes in order to increase the breakdown voltage as in the case of a Schottky diode, and the area occupied by a bidirectional Zener diode on the ESD-protective-function-equipped composite electronic component when viewed in plan view can be reduced.

The second semiconductor layers of the Zener diodes are disposed on the common plane. Consequently, a minimum number of Zener diodes are mounted on the ESD-protective-function-equipped composite electronic component, and each of the Zener diodes can be efficiently disposed in a limited space. Accordingly, the arrangement structure of the Zener diodes can be a simple structure, so that the ESD-protective-function-equipped composite electronic component in which a reduction in the element size thereof is achieved can be provided.

The ESD-protective-function-equipped composite electronic component may include a common semiconductor layer, which has the second conductivity type and which is commonly used as the second semiconductor layers of the plurality of Zener diodes, and a plurality of first semiconductor thin films each of which is formed in an island-like shape on the common semiconductor layer so as to form a corresponding one of the first semiconductor layers of the plurality of Zener diodes, each of the plurality of first semiconductor thin films forming a pn junction with the common semiconductor layer.

With this configuration, since the common semiconductor layer having the second conductivity type is commonly used as the second semiconductor layers of the Zener diodes, the arrangement structure of the Zener diodes can be a simpler structure, and a further reduction in the element size of the ESD-protective-function-equipped composite electronic component can be achieved. Since the first semiconductor layers of the Zener diodes are formed of the plurality of first semiconductor thin films, each of which is formed in an island-like shape on the common semiconductor layer and each of which forms a pn junction with the common semiconductor layer, each of the Zener diodes can be easily manufactured, and a reduction in the thickness of each of the Zener diodes can be achieved. Therefore, the ESD-protective-function-equipped composite electronic component can be further reduced in size and can be manufactured at low cost.

The ESD-protective-function-equipped composite electronic component may further include an insulating substrate. In addition, the common semiconductor layer may be formed of a second semiconductor thin film formed on the insulating substrate, and the thin-film circuit element may be disposed on a region of the insulating substrate, the region being different from a region in which the second semiconductor thin film has been formed.

With this configuration, since the common semiconductor layer is formed of the second semiconductor thin film formed on the insulating substrate, a further reduction in the thickness of each of the Zener diodes can be achieved. In addition, since the Zener diodes are formed of the common second semiconductor thin film and the plurality of first semiconductor thin films, each of which is formed in an island-like shape on the second semiconductor thin film, there is no need to perform a diffusion treatment or the like for doping impurities, and the Zener diodes can be easily formed by performing a common thin-film forming process. Furthermore, the ESD-protective-function-equipped composite electronic component having a practical configuration in which the thin-film circuit element is disposed in a region of the insulating substrate, the region being different from the region in which the second semiconductor thin film has been formed, can be provided.

The common semiconductor layer may be formed of a single-crystal or polycrystalline Si substrate, which is doped so as to have the second conductivity type, and the thin-film circuit element may be disposed on the Si substrate.

With this configuration, since the common semiconductor layer may be formed of the single-crystal or polycrystalline Si substrate, which is doped so as to have the second conductivity type, the carrier mobility is high, and the resistance component of the common semiconductor layer is small. Therefore, the series resistance of each of the bidirectional Zener diodes formed of the corresponding Zener diodes can be reduced, and thus, the thin-film circuit element disposed on the Si substrate can be protected with higher certainty.

In one exemplary aspect, the thin-film circuit element may be a thin-film capacitor, a thin-film inductor, a thin-film resistor, a thin-film thermistor, or a combination of the thin-film capacitor, the thin-film inductor, the thin-film resistor, and the thin-film thermistor.

With this configuration, the ESD-protective-function-equipped composite electronic component in which various circuits are formed as a result of combining such thin-film circuit elements can be provided.

The electrodes may be first, second and third electrodes-formed from extending and outer electrodes. Moreover, the ESD-protective-function-equipped composite electronic component may further include the thin-film capacitor connected in series between the first and second outer electrodes, and the thin-film inductor connected in series between the second and third outer electrodes.

With this configuration, an LC filter circuit can be formed of the thin-film inductor and the thin-film capacitor.

The outer electrodes may be first, second, third and fourth electrodes, and the ESD-protective-function-equipped composite electronic component may further include the variable-capacity thin-film capacitor connected in series between the first and second outer electrodes, the first thin-film resistor whose first end is connected to the third outer electrode, and the second thin-film resistor whose first end is connected to the fourth outer electrode. In addition, second ends of the first and second thin-film resistors may be connected to two ends of the thin-film capacitor such that the thin-film capacitor is inserted between the second ends of the first and second thin-film resistors.

With this configuration, a variable-capacity thin-film capacitor that uses the first and second outer electrodes as input and output terminals can be formed. In other words, the voltage to be applied to the two sides of the thin-film capacitor via the first and second thin-film resistors may be arbitrarily adjusted by adjusting the voltage between the third and fourth outer electrodes, so that the capacitance of the thin-film capacitor can be adjusted.

According to the present disclosure, the first semiconductor layers of the Zener diodes are connected to the corresponding outer electrodes, and the second semiconductor layers of the Zener diodes are electrically connected to one another, so that bidirectional Zener diodes can be inserted in series between all arbitrary outer electrodes by using a minimum number of Zener diodes. In addition, the second semiconductor layers of the Zener diodes are disposed on the common plane. Thus, a minimum number of Zener diodes are mounted on the ESD-protective-function-equipped composite electronic component, and each of the Zener diodes can be efficiently disposed in a limited space. Accordingly, the arrangement structure of the Zener diodes can be a simple structure, so that the ESD-protective-function-equipped composite electronic component in which a reduction in the element size thereof is achieved can be provided.

BRIEF DESCRIPTION OF DRAWINGS

FIG. 1(a) is a plan view, FIG. 1(b) is a cross-sectional view taken along line A-A of FIG. 1(a), and FIG. 1(c) is a cross-sectional view taken along line B-B of FIG. 1(a).

FIG. 3(a) is a plan view, FIG. 3(b) is a cross-sectional view taken along line A-A of FIG. 3(a), and FIG. 3(c) is a cross-sectional view taken along line B-B of FIG. 3(a).

FIG. 4(a) is a plan view, FIG. 4(b) is a cross-sectional view taken along line A-A of FIG. 4(a), and FIG. 4(c) is a cross-sectional view taken along line B-B of FIG. 4(a).

FIG. 6(a) is a cross-sectional view taken along line C-C of FIG. 5, FIG. 6(b) is a cross-sectional view taken along line D-D of FIG. 5, and FIG. 6(c) is a cross-sectional view taken along line E-E of FIG. 5.

FIG. 8(a) is a plan view, FIG. 8(b) is a cross-sectional view taken along line C-C of FIG. 8(a), FIG. 8(c) is a cross-sectional view taken along line D-D of FIG. 8(a)

FIG. 9(a) is a plan view, FIG. 9(b) is a cross-sectional view taken along line C-C of FIG. 9(a), FIG. 9(c) is a cross-sectional view taken along line D-D of FIG. 9(a), and FIG. 9(d) is a cross-sectional view taken along line E-E of FIG. 9(a).

FIG. 11(a) is a cross-sectional view taken along line C-C of FIG. 10, FIG. 11(b) is a cross-sectional view taken along line D-D of FIG. 10, and FIG. 11(c) is a cross-sectional view taken along line E-E of FIG. 10.

DETAILED DESCRIPTION

First Embodiment

Figure 1A:
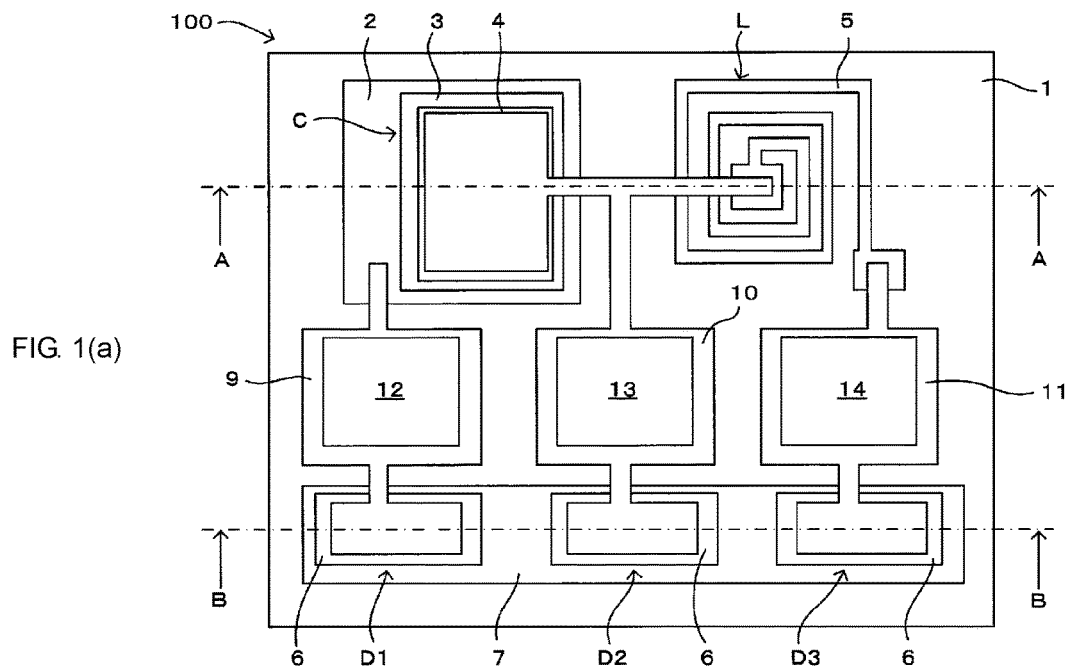
FIGS. 1(a), 1(b), and 1(c) illustrate an ESD-protective-function-equipped composite electronic component according to a first embodiment of the present disclosure.
Figure 1B:
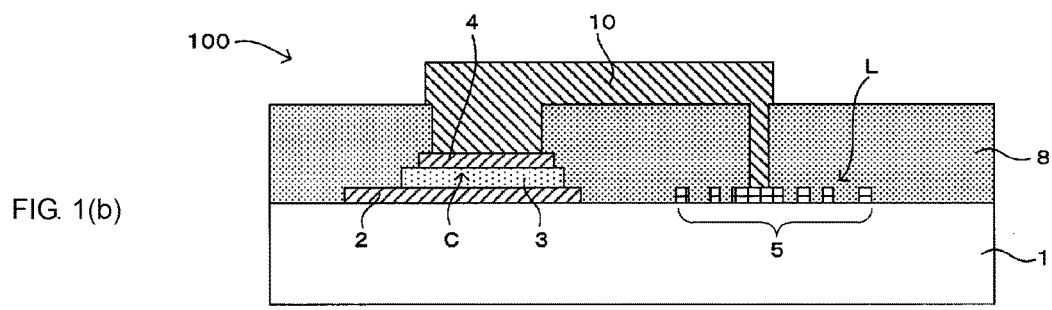
Figure 1C:
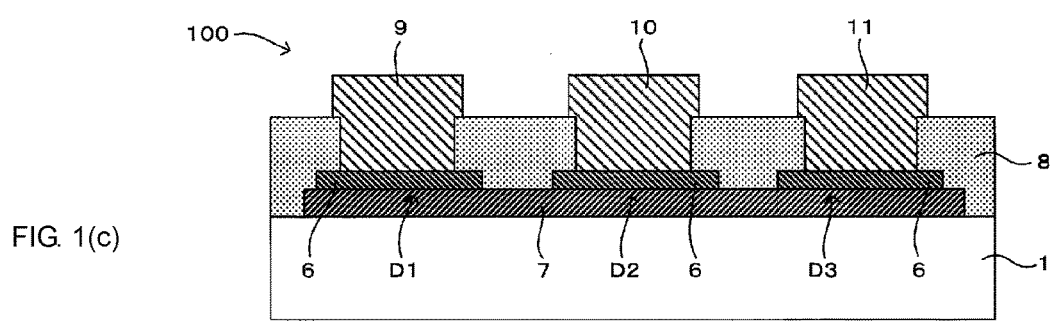
Figure 2:
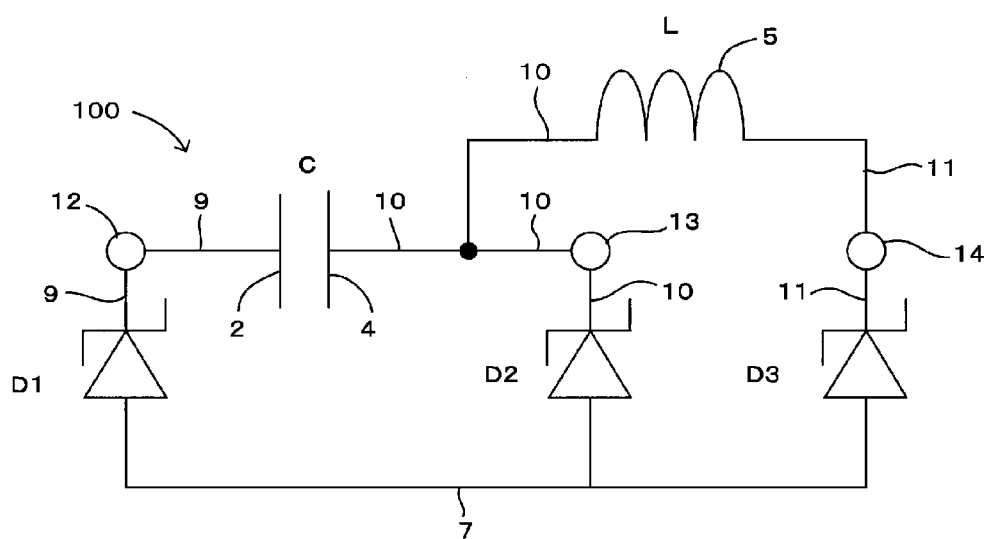
FIG. 2 illustrates an equivalent circuit of the ESD-protective-function-equipped composite electronic component illustrated in FIGS. 1(a) to 1(c).

A first embodiment will be described with reference to FIG. 1(a) to FIG. 4(c). In particular, FIGS. 1(a) to 1(c) illustrate an ESD-protective-function-equipped composite electronic component according to the first embodiment, where FIG. 1(a) is a plan view, FIG. 1(b) is a cross-sectional view taken along line A-A of FIG. 1(a), and FIG. 1(c) is a cross-sectional view taken along line B-B of FIG. 1(a). FIG. 2 is a diagram illustrating an equivalent circuit of the ESD-protective-function-equipped composite electronic component illustrated in FIGS. 1(a)-1(c).

Figure 3A:
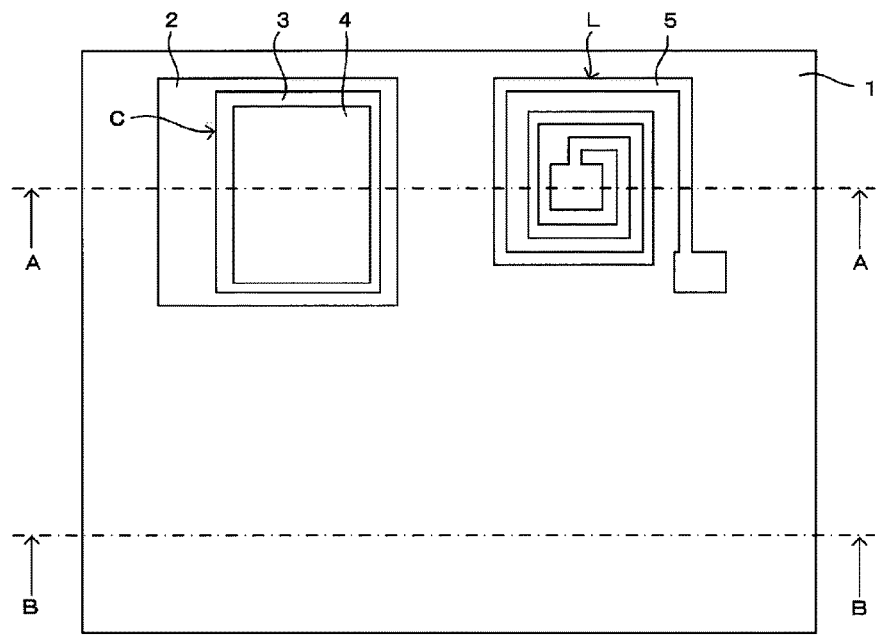
FIGS. 3(a), 3(b), and 3(c) illustrate an example of a method for manufacturing the ESD-protective-function-equipped composite electronic component.
Figure 3B:
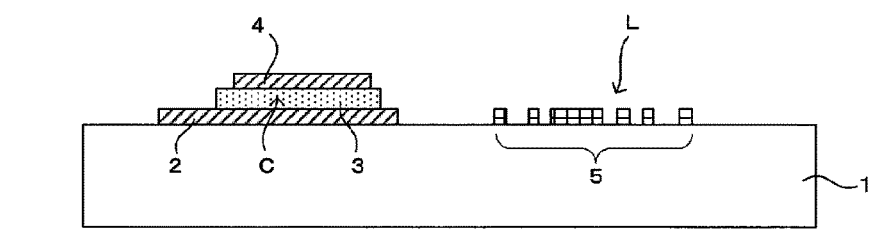
Figure 3C:
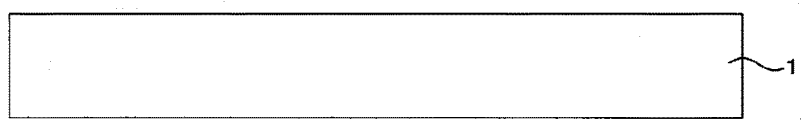
Figure 4A:
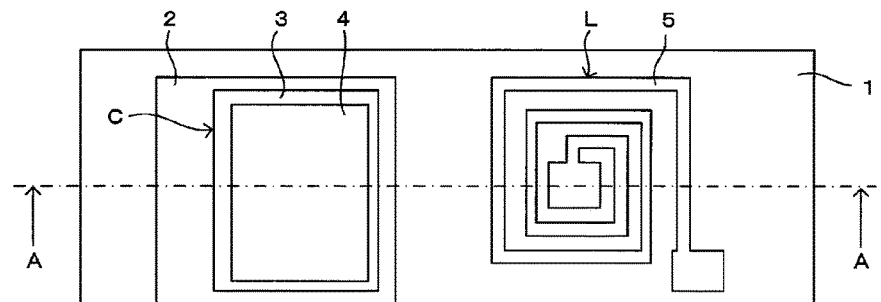
FIGS. 4(a), 4(b), and 4(c) illustrate an example of a method for manufacturing the ESD-protective composite electronic component that is subsequent to the step illustrated in FIGS. 3(a) to 3(c).
Figure 4B:
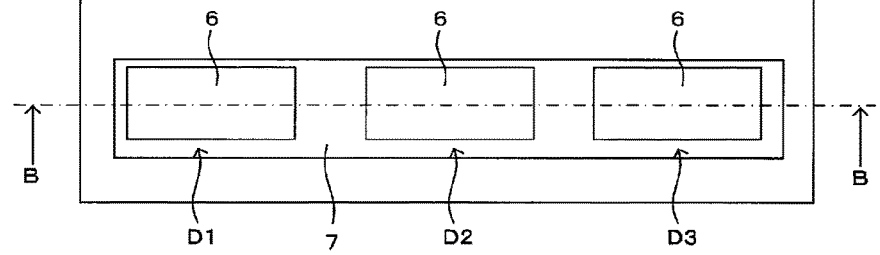
Figure 4C:
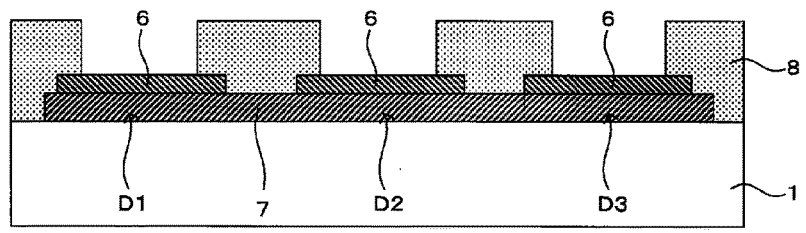

FIGS. 3(a) to 3(c) illustrate an example of a method for manufacturing the ESD-protective-function-equipped composite electronic component, FIG. 3(a) is a plan view, FIG. 3(b) is a cross-sectional view taken along line A-A of FIG. 3(a), and FIG. 3(c) is a cross-sectional view taken along line B-B of FIG. 3(a). FIGS. 4(a) to 4(c) illustrate an example of a method for manufacturing the ESD-protective-function-equipped composite electronic component that is subsequent to the step illustrated in FIGS. 3(a) to 3(c), FIG. 4(a) is a plan view, FIG. 4(b) is a cross-sectional view taken along line A-A of FIG. 4(a), and FIG. 4(c) is a cross-sectional view taken along line B-B of FIG. 4(a). It is noted that, in FIG. 1(a) and FIG. 4(a), an insulating layer 8 is not illustrated in order to illustrate the arrangement relationship between a thin-film capacitor C, a thin-film inductor L, and Zener diodes D1 to D3.

(Configuration)

The schematic configuration of an ESD-protective-function-equipped composite electronic component 100 will be described as follows.

As shown, the ESD-protective-function-equipped composite electronic component 100 includes the thin-film capacitor C (thin-film circuit element) and the thin-film inductor L (thin-film circuit element) that are disposed on an insulating substrate 1, such as a glass substrate, a ceramic substrate, a resin substrate, or a Si substrate. As illustrated in FIGS. 1(a) and 1(b), the thin-film capacitor C includes a capacitor electrode layer 2 that is formed of a Pt/Ti thin film in a predetermined region of a surface of the insulating substrate 1, a $SiO_2$ dielectric layer 3 that is formed on the capacitor electrode layer 2, and a capacitor electrode layer 4 that is formed of a Pt/Ti thin film on the dielectric layer 3. As illustrated in FIGS. 1(a) and 1(b), the thin-film inductor L includes an inductor electrode layer 5 that is formed of a Cu/Ti thin film in a predetermined region of the surface of the insulating substrate 1 so as to have a spiral shape when viewed in plan view.

As illustrated in FIGS. 1(a) and 1(c), the ESD-protective-function-equipped composite electronic component 100 further includes the three pn-junction-type Zener diodes D1 to D3 that are disposed in regions of the surface of the insulating substrate 1, the regions being different from the regions in which the thin-film capacitor C and the thin-film inductor L have been formed. Each of the Zener diodes D1 to D3 is formed as a result of a first semiconductor layer 6 whose conductivity type is one of p-type and n-type and a second semiconductor layer (common semiconductor layer 7) whose conductivity type is the other of p-type and n-type forming a pn junction together. For example, in the present embodiment, each of the Zener diodes D1 to D3 is formed in the following manner.

In other words, on the main surface of the insulating substrate 1, the p-type common semiconductor layer 7 that is commonly used as the second semiconductor layers of the Zener diodes D1 to D3 is formed of a second semiconductor thin film, which is formed of p-type $CuAlO_2$ (p-type semiconductor). In addition, the first semiconductor layers 6 of the Zener diodes D1 to D3 are each formed of one of three first semiconductor thin films, each of which is formed of n-type $TiO_2$ (n-type semiconductor) in an island-like shape on the common semiconductor layer 7.

Each of the Zener diodes D1 to D3 is formed as a result of a pn junction being formed at a joint interface between the corresponding first semiconductor layer 6 and the corresponding common semiconductor layer 7. Accordingly, as illustrated in FIGS. 1(a) and 1(c) and FIG. 2, as a result of the common semiconductor layer 7 being commonly used as the second semiconductor layers of the Zener diodes D1 to D3, the second semiconductor layers of the Zener diodes D1 to D3 are disposed on the same plane and are electrically connected to one another.

Preferably, the thin-film capacitor C, the thin-film inductor L, and the Zener diodes D1 to D3 are coated with the insulating layer 8 formed of a polyimide resin film. A Cu/Ti extended electrode 9 is formed on a top surface of the insulating layer 8, and the Cu/Ti extended electrode 9 enables the first semiconductor layer 6 of the Zener diode D1 and the capacitor electrode layer 2 of the thin-film capacitor C to be connected to each other via a hole formed in the insulating layer 8.

Moreover, a Cu/Ti extended electrode 10 is formed on the top surface of the insulating layer 8, and the Cu/Ti extended electrode 10 enables the first semiconductor layer 6 of the Zener diode D2, the capacitor electrode layer 4 of the thin-film capacitor C, and a first end of the inductor electrode layer 5, the first end being located on the center side of the inductor electrode layer 5, to be connected to one another via a hole formed in the insulating layer 8. A Cu/Ti extended electrode 11 is formed on the top surface of the insulating layer 8, and the Cu/Ti extended electrode 11 enables connection between the first semiconductor layer 6 of the Zener diode D3 and a second end of the inductor electrode layer 5 via a hole formed in the insulating layer 8. The second end is located on the outer periphery side of the inductor electrode layer 5.

As illustrated in FIG. 1(a), on the top surface of the insulating layer 8, an Au first outer electrode 12, an Au second outer electrode 13, and an Au third outer electrode 14 are respectively formed on the extended electrode 9, the extended electrode 10, and the extended electrode 11. According to the current disclosure, it is contemplated that each combination of extended and outer electrodes collectively form an electrode according to an exemplary embodiment.

In the ESD-protective-function-equipped composite electronic component 100, which is configured as described above, as illustrated in FIG. 2, the Zener diodes D1 to D3 are provided so as to correspond to the first, second and third outer electrodes 12 to 14, respectively, and each of the first semiconductor layers 6 is connected to a corresponding one of the first, second and third outer electrodes 12 to 14, which respectively correspond to the Zener diodes D1 to D3. The thin-film capacitor C is connected in series between the first and second outer electrodes 12 and 13, and the thin-film inductor L is connected in series between the second and third outer electrodes 13 and 14, so that an LC filter circuit in which a capacitor and an inductor are connected in series is formed.

As illustrated in FIG. 2, a bidirectional Zener diode is formed of the two Zener diodes D1 and D2 connected to each other in series in a reverse direction, and is connected with the thin-film capacitor C in parallel between the first and second outer electrodes 12 and 13. In addition, a bidirectional Zener diode is formed of the two Zener diodes D2 and D3 connected to each other in series in a reverse direction, and is connected with the thin-film inductor L in parallel between the second and third outer electrodes 13 and 14.

(Manufacturing Method)

An example of a method for manufacturing the ESD-protective-function-equipped composite electronic component 100 will be described as follows.

First, as illustrated in FIGS. 3(a) and 3(b), a Ti film having a thickness of about 50 nm is formed into a pattern on a predetermined region of the insulating substrate 1, such as a glass substrate, by using a lift-off technique, and a Pt film having a thickness of about 200 nm is formed into a pattern on the Ti film, so that the lower capacitor electrode layer 2 is formed. Next, a $SiO_2$ film, which forms the dielectric layer 3, is formed so as to have a thickness of about 100 nm by using a sputtering method. Then, the $SiO_2$ film is patterned by dry etching using photolithography, so that the dielectric layer 3 is formed.

Subsequently, a Ti film having a thickness of about 50 nm is formed into a pattern on the dielectric layer 3 by using the lift-off technique, and a Pt film having a thickness of about 200 nm is formed into a pattern, so that the upper capacitor electrode layer 4 is formed.

A Ti film having a thickness of about 50 nm is formed into a pattern on a predetermined region of the insulating substrate 1 by using the lift-off technique, and a Cu film having a thickness of about 2,000 nm is formed into a pattern on the Ti film, so that the inductor electrode layer 5 is formed.

Next, as illustrated in FIGS. 4(a) and 4(c), a p-type $CuAlO_2$ semiconductor thin film, which forms the common semiconductor layer 7, is deposited so as to have a thickness of about 500 nm by using the sputtering method. After that, the p-type $CuAlO_2$ semiconductor thin film is patterned by dry etching using photolithography, so that the common semiconductor layer 7 is formed. Subsequently, an n-type $TiO_2$ semiconductor thin film that forms the first semiconductor layers 6 is deposited so as to have a thickness of about 300 nm by using the sputtering method. Then, the n-type $TiO_2$ semiconductor thin film is patterned by dry etching using photolithography, so that the first semiconductor layers 6 are formed.

A photosensitive polyimide resin is applied to the insulating substrate 1 so as to have a thickness of about 3,000 nm, and the photosensitive polyimide resin is patterned by etching using photolithography and is thermally-cured, so that the insulating layer 8 is formed.

Next, as illustrated in FIGS. 1(a) to 1(c), a Ti film that forms the extended electrodes 9 to 11 is formed so as to have a thickness of about 100 nm by using the sputtering method, and a Cu film is deposited so as to have a thickness of about 1,000 nm. A photoresist pattern having openings that are located at positions on the Cu film, the positions corresponding to the first, second and third outer electrodes 12 to 14, is formed. At each of the positions of the openings of the photoresist pattern, a Ni film is deposited onto the Cu film by using an electrolytic plating method so as to have a thickness of about 2,000 nm, and an Au film is deposited so as to have a thickness of about 100 nm, so that the first, second and third outer electrodes 12 to 14 are formed.

Then, the extended electrodes 9 to 11 are formed as a result of the Cu/Ti film, which has been deposited by using the sputtering method, being patterned by wet etching using photolithography, so that the ESD-protective-function-equipped composite electronic component 100 is completed.

The ESD-protective-function-equipped composite electronic component 100, which is configured as described above, is used as an LC filter by being mounted on another wiring board or the like with solder, by wire bonding, or the like. Even if an overvoltage caused by static electricity or the like occurs in the process of sequentially mounting a plurality of various components onto the other wiring board or during the use of an apparatus that is equipped with the other wiring board, on which the plurality of various components have been mounted, an overcurrent flows through a current path formed on a bidirectional Zener diode side, the bidirectional Zener diode being inserted between any two electrodes among the first, second and third outer electrodes 12 to 14, as a result of one of the Zener diodes D1 to D3 breaking down, and consequently, the thin-film capacitor C and the thin-film inductor L, each of which has a low electrostatic resistance, can be protected.

As described above, in the present embodiment, the first semiconductor layers 6 of the Zener diodes D1 to D3 are connected to the corresponding first, second and third outer electrodes 12 to 14, and the second semiconductor layers of the Zener diodes D1 to D3 are formed of the common semiconductor layer 7 and thus are electrically connected to one another. Accordingly, a so-called bidirectional Zener diode, which is formed of two Zener diodes connected to each other in series in a reverse direction, is reliably inserted in series between arbitrarily selected two outer electrodes among the first, second and third outer electrodes 12 to 14. Therefore, bidirectional Zener diodes can be inserted in series between all arbitrary outer electrodes by using a minimum number of Zener diodes.

As a result, at least one thin-film circuit element, such as the thin-film capacitor C or the thin-film inductor L, and the bidirectional Zener diode, each of which is connected in series between arbitrary outer electrodes among the first, second and third outer electrodes 12 to 14, are reliably connected in parallel to each other between the outer electrodes. Consequently, a current path for overvoltages of both positive and negative polarities is formed on the bidirectional Zener diode side, and thus, at least one thin-film circuit element, which is connected in series between arbitrary outer electrodes, can be protected with certainty against overvoltages of both positive and negative polarities.

The bidirectional Zener diodes are formed of the corresponding pn junction Zener diodes D1 to D3, each of which includes a p-type semiconductor and an n-type semiconductor. Accordingly, the breakdown voltage can be set to a significantly high value. As a result, there is no need to connect in series a plurality of Schottky diodes in order to increase the breakdown voltage as in the case of a Schottky diode, and the areas occupied by the Zener diodes D1 to D3 on the ESD-protective-function-equipped composite electronic component 100 when viewed in plan view can be reduced.

In addition, the common semiconductor layer 7 is commonly used as the second semiconductor layers of the Zener diodes D1 to D3, so that the second semiconductor layers of the Zener diodes D1 to D3 are disposed on the same plane. Consequently, a minimum number of the Zener diodes D1 to D3 are mounted on the ESD-protective-function-equipped composite electronic component 100, and each of the Zener diodes D1 to D3 can be efficiently disposed in a limited space. Accordingly, the arrangement structure of the Zener diodes D1 to D3 can be a simple structure, so that the ESD-protective-function-equipped composite electronic component 100 in which a reduction in the element size thereof is achieved can be provided.

Since each of the first semiconductor layers 6 of the Zener diodes is formed of a corresponding one of the plurality of first semiconductor thin films, each of which is formed in an island-like shape on the common semiconductor layer 7 and each of which forms a pn junction with the common semiconductor layer 7, the Zener diodes D1 to D3 can be easily manufactured, and a reduction in the thickness of each of the Zener diodes D1 to D3 can be achieved. Therefore, the ESD-protective-function-equipped composite electronic component 100 can be further reduced in size and can be manufactured at low cost. In addition, since the common semiconductor layer 7 is formed of the second semiconductor thin film formed on the insulating substrate 1, a further reduction in the size of each of the Zener diodes D1 to D3 can be achieved.

Furthermore, the ESD-protective-function-equipped composite electronic component 100 that is equipped with the LC filter circuit formed of the thin-film inductor L and the thin-film capacitor C, which are protected against an overvoltage, and that has a practical configuration can be provided.

Second Embodiment

Figure 5:
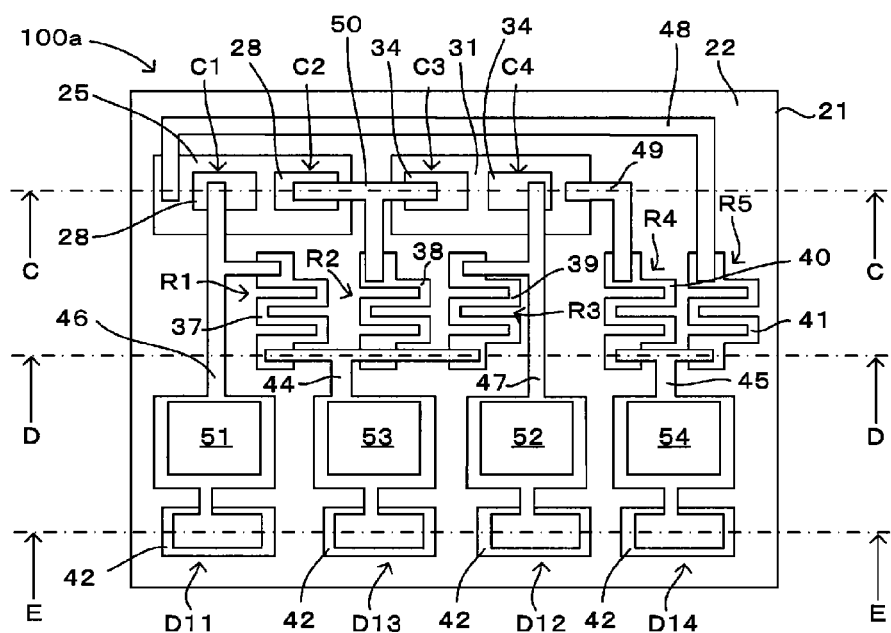
FIG. 5 is a plan view illustrating an ESD-protective-function-equipped composite electronic component according to a second embodiment of the present disclosure.
Figure 6A:
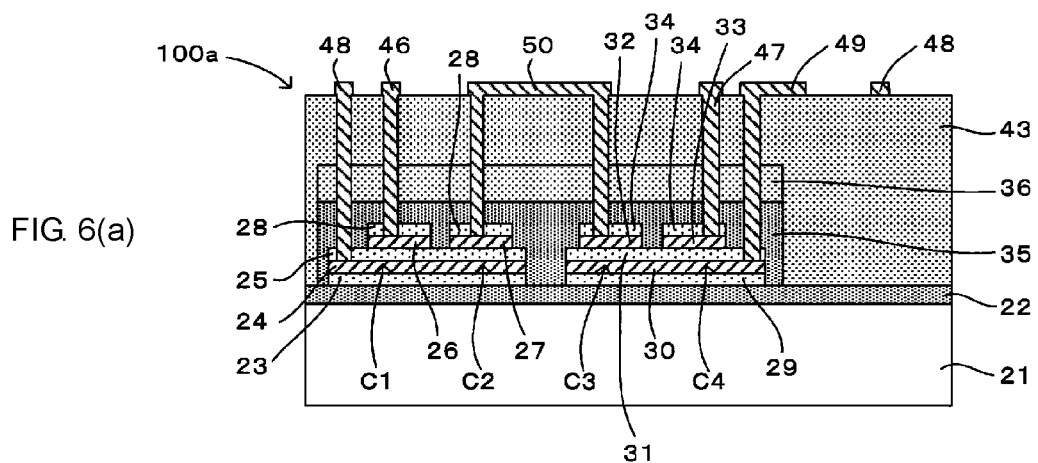
FIGS. 6(a), 6(b), and 6(c) illustrate the ESD-protective-function-equipped composite electronic component illustrated in FIG. 5.
Figure 6B:
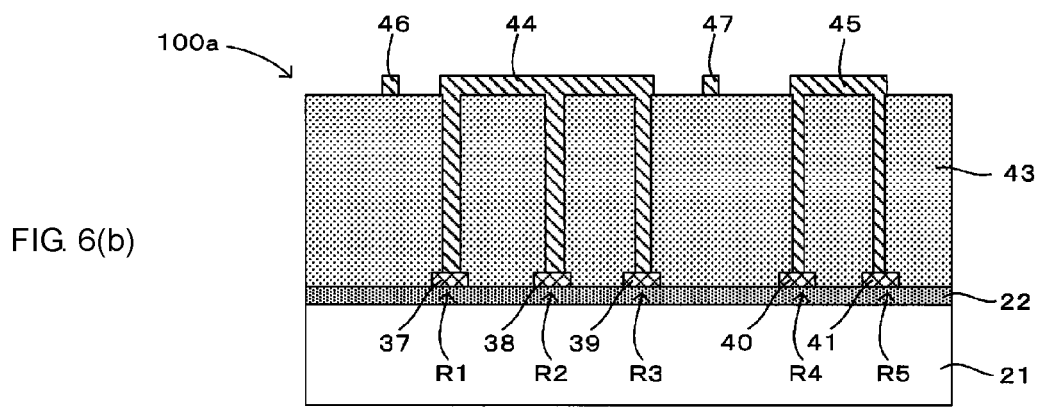
Figure 6C:
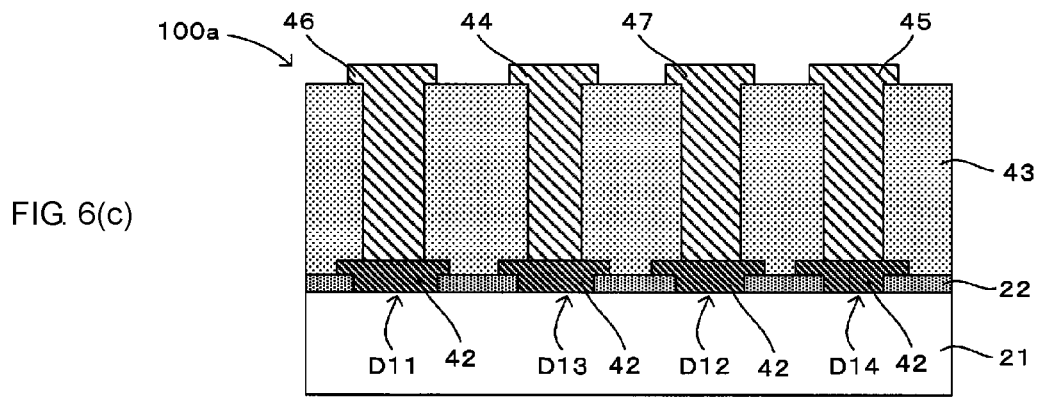
Figure 7:
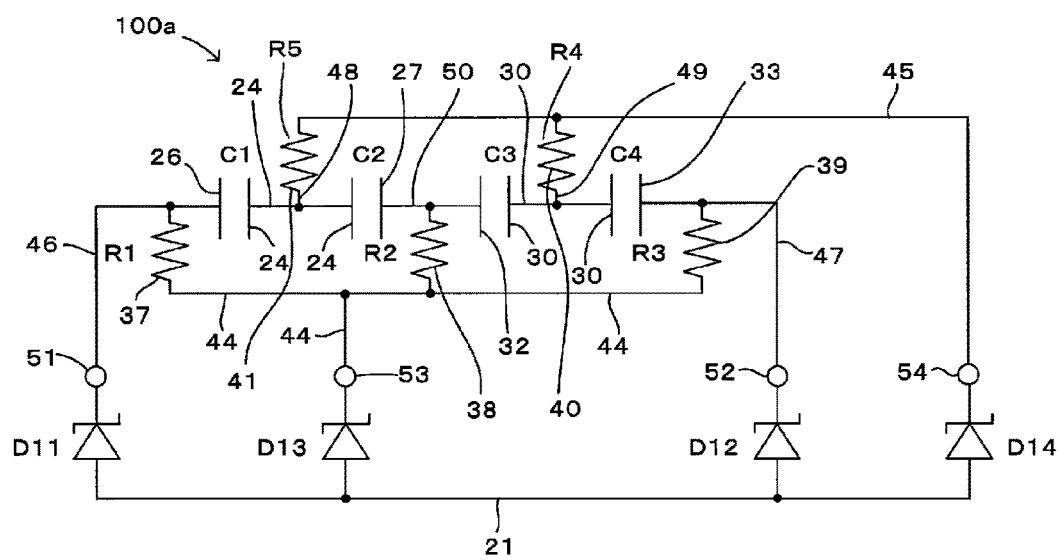
FIG. 7 illustrates an equivalent circuit of the ESD-protective-function-equipped composite electronic component illustrated in FIG. 5.

A second embodiment will be described in the following with reference to FIG. 5 to FIG. 11(d). In particular, FIG. 5 is a plan view illustrating an ESD-protective-function-equipped composite electronic component according to the second embodiment of the present disclosure. FIGS. 6(a) to 6(c) illustrate the ESD-protective-function-equipped composite electronic component illustrated in FIG. 5. FIG. 6(a) is a cross-sectional view taken along line C-C of FIG. 5, FIG. 6(b) is a cross-sectional view taken along line D-D of FIG. 5, and FIG. 6(c) is a cross-sectional view taken along line E-E of FIG. 5. FIG. 7 is a diagram illustrating an equivalent circuit of the ESD-protective-function-equipped composite electronic component illustrated in FIG. 5.

Figure 8A:
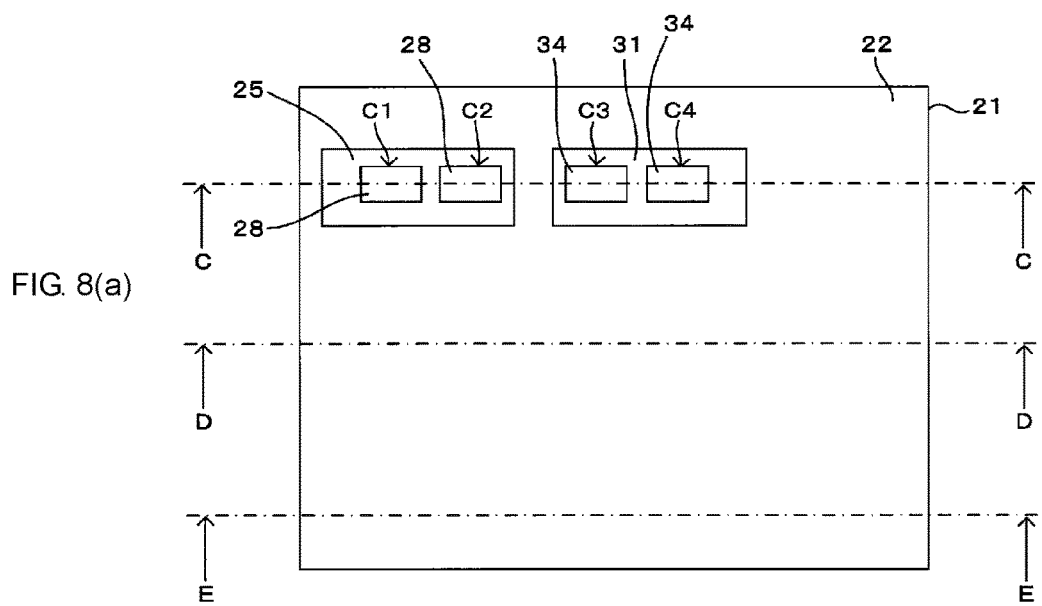
FIGS. 8(a), 8(b), and 8(c) illustrate an example of a method for manufacturing the ESD-protective-function-equipped composite electronic component.
Figure 8B:
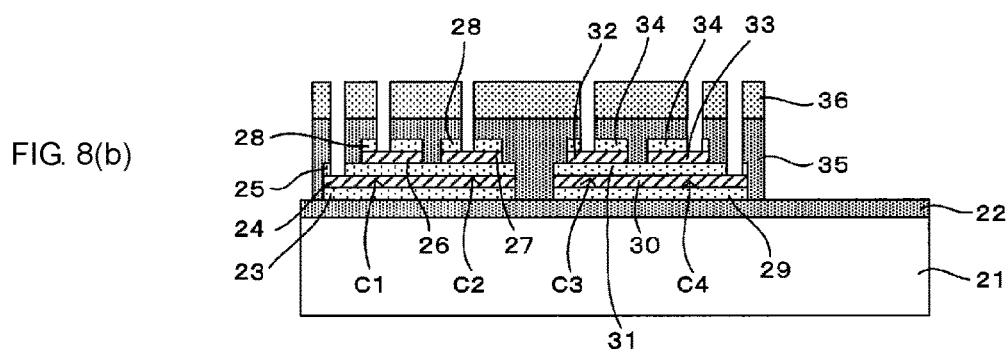
Figure 8C:
Figure 8D:
FIG. 8(d) is a cross-sectional view taken along line E-E of FIG. 8(a).
Figure 9A:
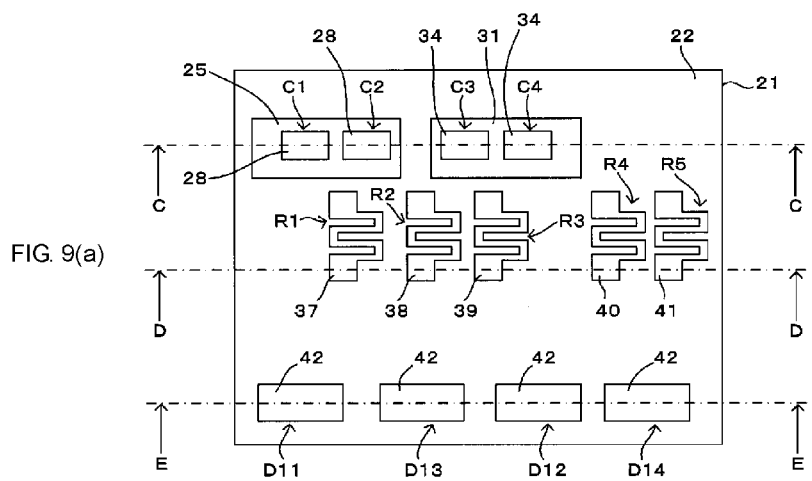
FIGS. 9(a)-9(d) illustrate an example of a method for manufacturing the ESD-protective-function-equipped composite electronic component that is subsequent to the step illustrated in FIGS. 8(a) to 8(d)
Figure 9B:
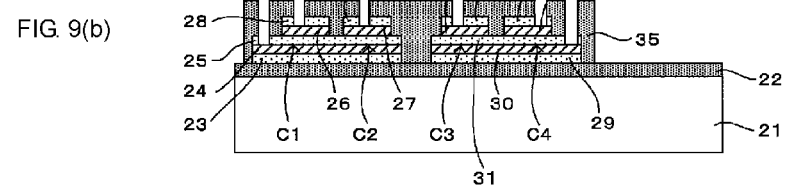
Figure 9C:
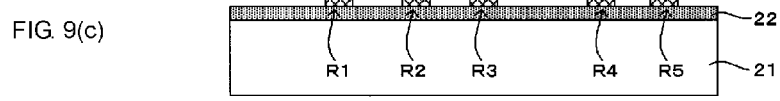
Figure 9D:
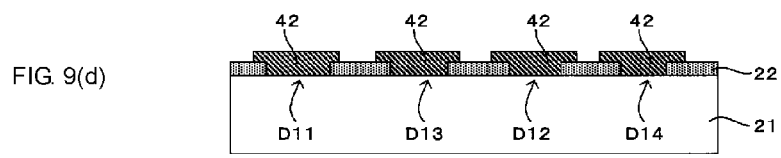
Figure 10:
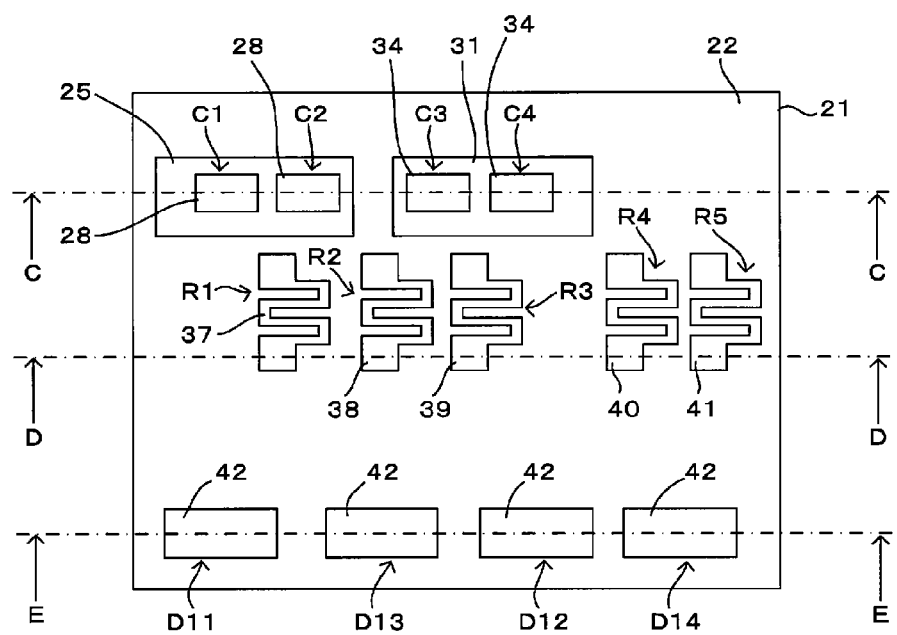
FIG. 10 is a plan view illustrating an example of a method for manufacturing the ESD-protective-function-equipped composite electronic component that is subsequent to the method illustrated in FIGS. 9(a) to 9(d).
Figure 11A:
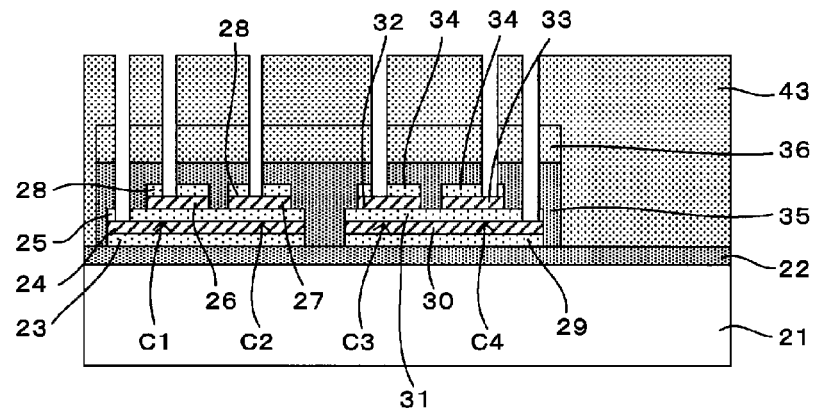
FIGS. 11(a) to 11(c) illustrate an example of a method for manufacturing the ESD-protective-function-equipped composite electronic component that is subsequent to the step illustrated in FIGS. 9(a) to 9(d).
Figure 11B:
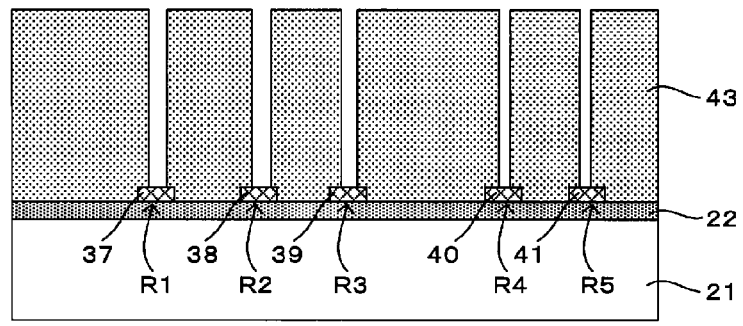
Figure 11C:
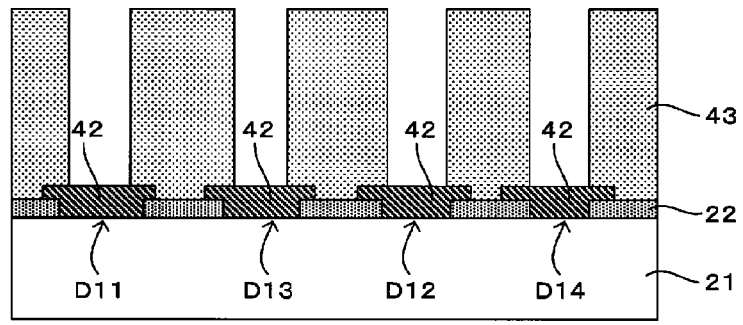
Figure 12:
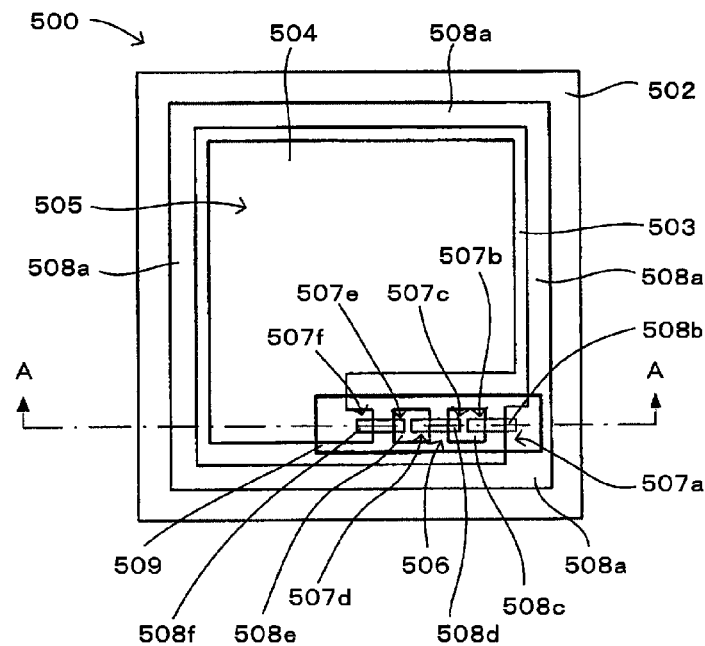
FIG. 12 is a plan view illustrating an ESD-protective-function-equipped composite electronic component of the related art.
Figure 13:
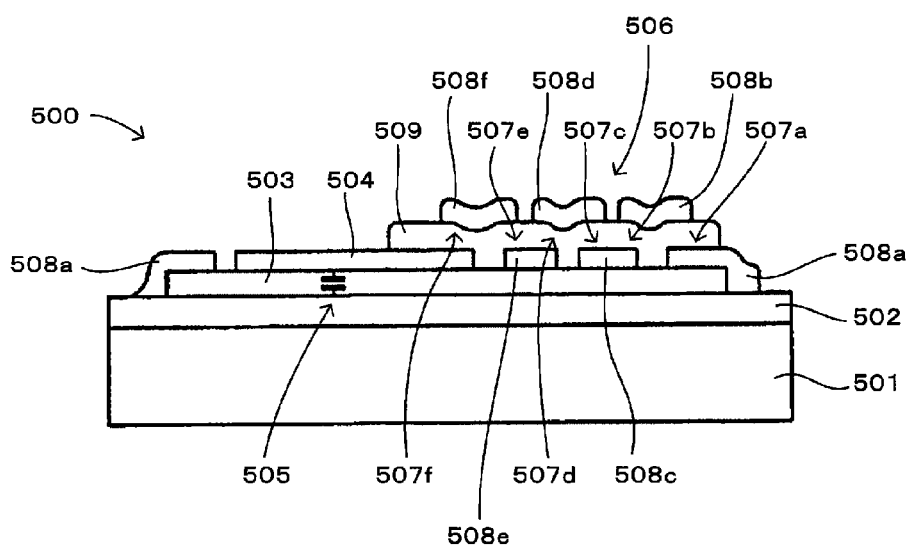
FIG. 13 is a cross-sectional view taken along line A-A of FIG. 12.

FIGS. 8(a) to 8(d) illustrate an example of a method for manufacturing the ESD-protective-function-equipped composite electronic component. FIG. 8(a) is a plan view, FIG. 8(b) is a cross-sectional view taken along line C-C of FIG. 8(a), FIG. 8(c) is a cross-sectional view taken along line D-D of FIG. 8(a), and FIG. 8(d) is a cross-sectional view taken along line E-E of FIG. 8(a). FIGS. 9(a) to 9(d) illustrate an example of a method for manufacturing the ESD-protective-function-equipped composite electronic component that is subsequent to the steps illustrated in FIGS. 8(a) to 8(d). FIG. 9(a) is a plan view, FIG. 9(b) is a cross-sectional view taken along line C-C of FIG. 9(a), FIG. 9(c) is a cross-sectional view taken along line D-D of FIG. 9(a), and FIG. 9(d) is a cross-sectional view taken along line E-E of FIG. 9(a). FIG. 10 is a plan view illustrating an example of a method for manufacturing the ESD-protective-function-equipped composite electronic component that is subsequent to the step illustrated in FIGS. 9(a) to 9(d). FIGS. 11(a) to 11(c) illustrate an example of a method for manufacturing the ESD-protective-function-equipped composite electronic component that is subsequent to the step illustrated in FIGS. 9(a) to 9(d). FIG. 11(a) is a cross-sectional view taken along line C-C of FIG. 10, FIG. 11(b) is a cross-sectional view taken along line D-D of FIG. 10, and FIG. 11(c) is a cross-sectional view taken along line E-E of FIG. 10.

It is noted that, in FIG. 5, FIG. 8(a), FIG. 9(a), and FIG. 10, a protective layer 35 and insulating layers 36 and 43 are not illustrated in order to illustrate the arrangement relationship between thin-film capacitors C1 to C4, thin-film resistors R1 to R5, and Zener diodes D11 to D14. In addition, in the following description, differences between the present embodiment and the above-described embodiment will be mainly described, and since the rest of the configuration of the present embodiment is similar to that of the above-described embodiment, the description thereof will be omitted by using the same reference numerals.

(Configuration)

The schematic configuration of an ESD-protective-function-equipped composite electronic component 100a will now be described.

The ESD-protective-function-equipped composite electronic component 100a includes a p-type single-crystal Si substrate 21 (B-doped, a resistivity of 0.4 Ω·cm) on which a thermal oxide $SiO_2$ insulating layer 22 has been formed, and the four variable-capacity thin-film capacitors C1 to C4 (thin-film circuit elements) and the five thin-film resistors R1 to R5 (thin-film circuit elements) are disposed on the Si substrate 21.

The thin-film capacitors C1 and C2 are formed of a common capacitor electrode layer 24, which is formed of a Pt thin film on a (Ba, Sr) $TiO_3$ (hereinafter referred to as BST) close-contact layer 23 formed on a predetermined region of the insulating layer 22; a BST dielectric layer 25, which is formed on the common capacitor electrode layer 24; and capacitor electrode layers 26 and 27, each of which is formed of a Pt thin film on the BST dielectric layer 25. In addition, BST protective layers 28 are formed on the capacitor electrode layers 26 and 27.

In the exemplary embodiment, the thin-film capacitors C3 and C4 are formed of a common capacitor electrode layer 30, which is formed of a Pt thin film on a BST close-contact layer 29 formed on a predetermined region of the insulating layer 22; a BST dielectric layer 31, which is formed on the common capacitor electrode layer 30; and capacitor electrode layers 32 and 33, each of which is formed of a Pt thin film on the BST dielectric layer 31. In addition, BST protective layers 34 are formed on the capacitor electrode layers 32 and 33.

Moreover, the thin-film capacitors C1 to C4 are preferably coated with the protective layer 35 formed of a $SiO_2$ moisture-resistant protective film, and the insulating layer 36 formed of a polyimide resin film is stacked on the protective layer 35.

The thin-film resistors R1 to R5 respectively include resistance electrode layers 37 to 41, each of which is formed of a CrNi resistance thin film on a predetermined region of the insulating layer 22 so as to have a meandering shape when viewed in plan view.

In addition, as illustrated in FIG. 5 and FIG. 6(c), the ESD-protective-function-equipped composite electronic component 100a includes the four pn junction Zener diodes D11 to D14 that are disposed in regions of a surface of the Si substrate 21, the regions being different from the regions in which the thin-film capacitors C1 to C4 and the thin-film resistors R1 to R5 have been formed. Each of the Zener diodes D11 to D14 is formed as a result of a first semiconductor layer 42 whose conductivity type is one of p-type and n-type and a second semiconductor layer (Si substrate 21)

whose conductivity type is the other of p-type and n-type forming a pn junction together. For example, in the present embodiment, each of the Zener diodes D11 to D14 is formed in the following manner.

That is to say, the Si substrate 21 is formed so as to have a p-type as a result of being B-doped, and the p-type common semiconductor layer that is commonly used as the second semiconductor layers of the Zener diodes D11 to D14 is formed of the Si substrate 21. The first semiconductor layers 42 of the Zener diodes D11 to D14 are formed of four first semiconductor thin films, each of which is formed of n-type a-Si into an island-like shape on the Si substrate 21. It is noted that, in the present embodiment, although each of the first semiconductor layers 42 is actually formed by sequentially forming a Ti film and a Cu film on an n-type a-Si semiconductor thin film, this configuration is not illustrated in the drawings.

Each of the Zener diodes D11 to D14 is formed as a result of a pn junction being formed at a joint interface between the corresponding first semiconductor layer 42 and the Si substrate 21. Accordingly, as illustrated in FIG. 5, FIG. 6(c), and FIG. 7, as a result of the Si substrate 21 being commonly used as the second semiconductor layers of the Zener diodes D11 to D14, the second semiconductor layers of the Zener diodes D11 to D14 are disposed on the same plane and are electrically connected to one another. It is noted that the common semiconductor layer may be formed of a polycrystalline Si substrate.

In addition, the thin-film resistors R1 to R5, the Zener diodes D11 to D15, and the insulating layer 36 are coated with the insulating layer 43 formed of an epoxy resin film. A Cu/Ti extended electrode 44 is formed on a top surface of the insulating layer 43, and the Cu/Ti extended electrode 44 enables the first semiconductor layer 42 of the Zener diode D13 and first ends of the thin-film resistors R1 to R3 to be connected to one another via a hole formed in the insulating layer 43.

A Cu/Ti extended electrode 45 is formed on the top surface of the insulating layer 43, and the Cu/Ti extended electrode 45 enables the first semiconductor layer 42 of the Zener diode D14 and first ends of the thin-film resistors R4 and R5 to be connected to one another via a hole formed in the insulating layer 43. A Cu/Ti extended electrode 46 is formed on the top surface of the insulating layer 43, and the Cu/Ti extended electrode 46 enables connection between the first semiconductor layer 42 of the Zener diode D11, the capacitor electrode layer 26 of the thin-film capacitor C1, and a second end of the thin-film resistor R1 via holes formed in the protective layer 35 and the insulating layers 36 and 43.

A Cu/Ti extended electrode 47 is formed on the top surface of the insulating layer 43, and the Cu/Ti extended electrode 47 enables connection between the first semiconductor layer 42 of the Zener diode D12, the capacitor electrode layer 33 of the thin-film capacitor C4, and a second end of the thin-film resistor R3 via holes formed in the protective layer 35 and the insulating layers 36 and 43. A Cu/Ti extended electrode 48 is formed on the top surface of the insulating layer 43, and the Cu/Ti extended electrode 47 enables a second end of the thin-film resistor R5 and the common capacitor electrode layer 24 of the thin-film capacitors C1 and C2 to be connected to each other via holes formed in the protective layer 35 and the insulating layers 36 and 43.

A Cu/Ti extended electrode 49 is formed on the top surface of the insulating layer 43, and the Cu/Ti extended electrode 49 enables a second end of the thin-film resistor R4 and the common capacitor electrode layer 30 of the thin-film capacitors C3 and C4 to be connected to each other via holes formed in the protective layer 35 and the insulating layers 36 and 43. A Cu/Ti extended electrode 50 is formed on the top surface of the insulating layer 43, and the Cu/Ti extended electrode 50 enables connection between a second end of the thin-film resistor R2, the capacitor electrode layer 27 of the thin-film capacitor C2, and the capacitor electrode layer 32 of the thin-film capacitor C3 via holes formed in the protective layer 35 and the insulating layers 36 and 43.

As illustrated in FIG. 5, on the top surface of the insulating layer 43, an Au first outer electrode 51 is formed on the extended electrode 46, and an Au second outer electrode 52 is formed on the extended electrode 47. In addition, on the top surface of the insulating layer 43, an Au third outer electrode 53 is formed on the extended electrode 44, and an Au fourth outer electrode 54 is formed on the extended electrode 45.

In the ESD-protective-function-equipped composite electronic component 100a, which is configured as described above, as illustrated in FIG. 7, the Zener diodes D11 to D14 are provided so as to correspond to the first, second, third and fourth outer electrodes 51 to 54, respectively, and the first semiconductor layers 42 are connected to the corresponding first, second, third and fourth outer electrodes 51 to 54, which respectively correspond to the Zener diodes D11 to D14. In addition, the four thin-film capacitors C1 to C4 are connected in series between the first and second outer electrodes 51 and 52. Second ends of the thin-film resistors R1 to R3 and second ends of the thin-film resistors R4 and R5 are each connected to one of the two sides of the thin-film capacitors C1 to C4 such that one of the thin-film capacitors C1 to C4 is inserted between the second end of one of the thin-film resistors R1 to R3, whose first ends are connected to the third outer electrode 53, and the second end of one of the thin-film resistors R4 and R5, whose first ends are connected to the fourth outer electrode 54.

More specifically, each of the second ends of the thin-film resistors R1 to R5 and a corresponding one of the two sides of the thin-film capacitors C1 to C4 are connected to each other such that the thin-film capacitor C1 is inserted between the second ends of the thin-film resistors R1 and R5, the thin-film capacitor C2 is inserted between the second ends of the thin-film resistors R5 and R2, the thin-film capacitor C3 is inserted between the second ends of the thin-film resistors R2 and R4, and the thin-film capacitor C4 is inserted between the second ends of the thin-film resistors R4 and R3. As described above, each of the thin-film resistors R1 to R3 corresponds to the first thin-film resistor according to the present disclosure, and each of the thin-film resistors R4 and R5 corresponds to the second thin-film resistor according to the present disclosure.

(Manufacturing Method)

An example of a method for manufacturing the ESD-protective-function-equipped composite electronic component 100a will be described as follows.

First, the $SiO_2$ insulating layer 22 is formed on the p-type single-crystal Si substrate 21 by using a thermal oxidation method. Next, as illustrated in FIGS. 8(a) and 8(b), a BST film that forms the close-contact layers 23 and 29 is deposited by using an MOD method (firing condition: 660° C., heating time: 30 minutes, heating condition: $O_2$ atmosphere) so as to have a film thickness of about 90 nm. Subsequently, a Pt film that forms the lower common capacitor electrode layers 24 and 30 is deposited by using a sputtering method so as to have a film thickness of 200 nm.

Next, a BST film that forms the dielectric layers 25 and 31 is deposited by using a MOD method (firing condition: 660° C., heating time: 30 minutes, heating condition: $O_2$ atmosphere) so as to have a film thickness of about 90 nm. Subsequently, a Pt film that forms the upper common capacitor electrode layers 26, 27, 32, and 33 is deposited by using a sputtering method so as to have a film thickness of 200 nm. Then, a BST film that forms the protective layers 28 and 34 is deposited by using a MOD method (firing condition: 660° C., heating time: 30 minutes, heating condition: $O_2$ atmosphere) so as to have a film thickness of about 90 nm.

Subsequently, patterning is performed by dry etching using photolithography, so that the protective layers 28 and 34, and the capacitor electrode layers 26, 27, 32, and 33 are formed. In addition, patterning is performed by dry etching using photolithography, so that the dielectric layers 25 and 31, the common capacitor electrode layers 24 and 30, and the close-contact layers 23 and 29 are formed. After that, a heat treatment is performed in the $O_2$ atmosphere at about 850° C. for about 30 minutes, so that the dielectric layers 25 and 31 are fired.

Subsequently, a $SiO_2$ film that forms the protective layer 35, which functions as a moisture-resistant protective film, is formed so as to have a thickness of about 1,000 nm. In addition, a photosensitive polyimide resin is applied onto the $SiO_2$ film so as to have a thickness of about 3,000 nm, and the photosensitive polyimide resin is patterned by using photolithography and is thermally-cured. Patterning is performed by dry etching using this polyimide resin layer as a mask, so that the protective layer 35 and the insulating layer 36 are formed. In addition, portions of the protective layers 28 and 34, and portions of the dielectric layers 25 and 31 are also patterned by dry etching, and portions of the capacitor electrode layers 26, 27, 32, and 33 and portions of the common capacitor electrode layers 24 and 30 are exposed.

Then, as illustrated in FIGS. 9(a) and 9(c), an NiCr film having a thickness of about 50 nm is formed into a pattern on the insulating layer 22 by using a lift-off technique, so that the resistance electrode layers 37 to 41, which are respectively included in the thin-film resistors R1 to R5, are formed.

Next, four openings for forming the Zener diodes D11 to D14 are formed in regions of the insulating layer 22 ($SiO_2$ layer) by wet etching using photolithography, the regions being different from the regions in which the thin-film capacitors C1 to C4 and the thin-film resistors R1 to R5 have been formed, and the Si substrate 21 is exposed. Subsequently, by using the sputtering method, an n-type a-Si semiconductor thin film that forms the first semiconductor layers 42 is deposited so as to have a thickness of about 100 nm, a Ti film is deposited so as to have a thickness of about 100 nm, and a Cu film is deposited so as to have a thickness of about 500 nm. Then, patterning is performed by dry etching using photolithography, so that the first semiconductor layers 42 are formed. It is noted that, before spattering is performed on the n-type a-Si, the surface of the Si substrate 21 may be cleaned by performing an ion bombardment treatment on the surface of the Si substrate 21 as necessary.

As illustrated in FIG. 10 and FIGS. 11(a) to 11(c), the insulating layer 43 is formed as a result of applying a photosensitive epoxy resin, performing patterning by etching using photolithography and thermal curing.

Subsequently, as illustrated in FIG. 5 and FIGS. 6(a) to 6(c), by using the sputtering method, a Ti film that forms the extended electrodes 44 to 50 is formed so as to have a thickness of about 100 nm, and a Cu film is deposited so as to have a thickness of about 1,000 nm. A photoresist pattern having openings that are located at positions on the Cu film, the positions corresponding to the first, second, third and fourth outer electrodes 51 to 54, is formed. At each of the positions of the openings of the photoresist pattern, a Ni film is deposited onto the Cu film by using an electrolytic plating method so as to have a thickness of about 2,000 nm, and an Au film is deposited so as to have a thickness of about 100 nm, so that the first, second, third and fourth outer electrodes 51 to 54 are formed.

Then, the extended electrodes 44 to 50 are formed as a result of the Cu/Ti film, which has been deposited by using the sputtering method, being patterned by wet etching using photolithography, so that the ESD-protective-function-equipped composite electronic component 100a is completed.

The ESD-protective-function-equipped composite electronic component 100a, which is configured as described above, is used as a variable-capacity element, which uses the first and second outer electrodes 51 and 52 as input and output terminals, by being mounted on another wiring board or the like with solder, by wire bonding, or the like. In other words, the voltages to be applied to the two sides of the thin-film capacitors C1 to C4 via the thin-film resistors R1 to R5 are arbitrarily adjusted by varying the voltage between the third and fourth outer electrodes 53 and 54, so that the capacitance of each of the thin-film capacitors C1 to C4 can be adjusted.

In addition, similar to the ESD-protective-function-equipped composite electronic component 100 illustrated in FIGS. 1(a) to 1(c), even if an overvoltage caused by static electricity or the like occurs in the process of sequentially mounting a plurality of various components onto another wiring board or during the use of an apparatus that is equipped with the other wiring board, on which the plurality of various components have been mounted, an overcurrent flows through a current path formed on a bidirectional Zener diode side, the bidirectional Zener diode being inserted between arbitrary two electrodes among the first, second, third and fourth outer electrodes 51 to 54, as a result of one of the Zener diodes D11 to D14 breaking down, and consequently, the thin-film capacitors C1 to C4 and the thin-film resistors R1 to R5, each of which has a low electrostatic resistance, can be protected.

As described above, in the present embodiment, since the common semiconductor layer is formed of the single-crystal or polycrystalline Si substrate 21, which is doped so as to have a p-type, the carrier mobility is high, and the resistance component of the common semiconductor layer is small. Therefore, the series resistance of each of the bidirectional Zener diodes formed of the corresponding Zener diodes D11 to D14 can be reduced, and thus, thin-film circuit elements, such as the thin-film capacitors C1 to C4 and the thin-film resistors R1 to R5, that are disposed on the Si substrate 21 can be protected with higher certainty.

It is noted that various changes other than those described above can also be made within the scope of the present disclosure. For example, the types and the numbers of the thin-film circuit elements connected in series between arbitrary outer electrodes are not limited to those described above as examples, and thin-film circuit elements, such as thin-film capacitors, thin-film inductors, thin-film resistors, and thin-film thermistors, may be combined in any combination and may be connected in series between arbitrary outer electrodes. As a result, an ESD-protective-function-equipped composite electronic component in which various circuits are formed as a result of combining the thin-film circuit elements can be provided. The ESD-protective-function-equipped composite electronic component can be applied to various composite electronic components including semiconductor devices as well as an ESD-protective-function-equipped variable-capacity element.

In addition, in the above-described embodiments, although each of the Zener diodes is formed of the p-type first semiconductor layer and the n-type second semiconductor layer, each of the Zener diodes may be formed of an n-type first semiconductor layer and a p-type second semiconductor layer. As a result, two Zener diodes that are disposed between arbitrary outer electrodes may form a bidirectional Zener diode by being connected in series in a reverse direction on their cathode side. Furthermore, the second semiconductor layers of the Zener diodes may be disposed on the same plane while being isolated from one another.

When stacking p-type and n-type semiconductor layers, a second semiconductor layer that has a second conductivity type, which is one of p-type and n-type, and that is to be formed on a first semiconductor layer that has a first conductivity type, which is the other of p-type and n-type, and that is formed first may be made of an amorphous material. In this case, even in the case where the first semiconductor layer, which is formed first and which has the first conductivity type, is made of one of an amorphous material and a crystalline material, formation of a different phase, which causes deterioration of characteristics of the Zener diode, in an initial growth layer when the second semiconductor layer, which has the second conductivity type, is formed on the first semiconductor layer, which has the first conductivity type, can be suppressed.

The configurations of the thin-film capacitors, the thin-film inductors, the thin-film resistors, and the thin-film thermistors are not limited to those described above as examples as long as they each have the configuration of a common thin-film circuit element.

In addition, the dielectric materials of the dielectric layers and the semiconductor materials of the semiconductor layers are not limited to those described above as examples. For example, each of the dielectric layers may be made of a dielectric material, such as $BaTiO_3$, $SrTiO_3$, or $PbTiO_3$. The n-type semiconductor layer may be made of a semiconductor material, such as $In_2O_3$ or $InGaZnO_4$. The p-type semiconductor may be made of a semiconductor material, such as $Cu_2O$ or $SrCu_2O_2$.

It is contemplated that the present disclosure can be widely applied to an ESD-protective-function-equipped composite electronic component that has a protective function against an overvoltage caused by electrostatic discharge or the like.

REFERENCE SIGNS LIST 1 insulating substrate
6, 42 first semiconductor layer
7 common semiconductor layer (second semiconductor layer)
12 to 14, 51 to 54 outer electrode
21 Si substrate (common semiconductor layer, second semiconductor layer)
100, 100a ESD-protective-function-equipped composite electronic component
C, C1 to C4 thin-film capacitor (thin-film circuit element)
D1 to D3, D11 to D14 Zener diode
L thin-film inductor (thin-film circuit element)
R1 to R5 thin-film resistor (thin-film circuit element)

The invention claimed is:
1. An ESD-protective-function-equipped composite electronic component comprising:
a plurality of electrodes;
a substrate;
at least one thin-film circuit element connected in series between at least two electrodes of the plurality of electrodes; and
a plurality of pn junction Zener diodes that each correspond to a respective electrode and each include first and second semiconductor layers, with the first semiconductor layers disposed on the second semiconductor layers, respectively, and the second semiconductor layer each disposed on the substrate,
wherein the first semiconductor layer of each of the pn junction Zener diodes is connected to a corresponding electrodes and the second semiconductor layers are electrically connected to one another.
2. The ESD-protective-function-equipped composite electronic component according to claim 1, wherein the second semiconductor layers are disposed on a common plane of the substrate.
3. The ESD-protective-function-equipped composite electronic component according to claim 1, wherein the first semiconductor layers are one of p-type and n-type and the second semiconductor layers are another of p-type and n-type.
4. The ESD-protective-function-equipped composite electronic component according to claim 1, wherein the second semiconductor layers of the pn junction Zener diodes comprise a common semiconductor layer.
5. The ESD-protective-function-equipped composite electronic component according to claim 4,
wherein each of the first semiconductor layers comprises an island-like shape with an insulating layer disposed between each adjacent first semiconductor layer, and
wherein each of the first semiconductor layers is disposed on the common semiconductor layer to form a pn junction with the common semiconductor layer.
6. The ESD-protective-function-equipped composite electronic component according to claim 5,
wherein the substrate is an insulating substrate having a first region and a second region that is different from the first region, and
wherein the at least one thin-film circuit element is disposed on the first region of the substrate and the common semiconductor layer is disposed on the second region of the substrate.
7. The ESD-protective-function-equipped composite electronic component according to claim 6,
wherein the insulating substrate is a Si substrate, and
wherein the at least one thin-film circuit element is disposed on the Si substrate.
8. The ESD-protective-function-equipped composite electronic component according to claim 1, wherein the at least one thin-film circuit element includes at least one of a thin-film capacitor, a thin-film inductor, a thin-film resistor, and a thin-film thermistor.
9. The ESD-protective-function-equipped composite electronic component according to claim 1,
wherein the plurality of electrodes include first, second and third electrodes,
wherein the at least one thin-film circuit element includes a thin-film capacitor and a thin-film inductor, and wherein the thin-film capacitor is connected in series between the first and second electrodes and the thin-film inductor is connected in series between the second and third electrodes.

10. The ESD-protective-function-equipped composite electronic component according to claim 1,
wherein the plurality of electrodes include first, second, third and fourth electrodes,
wherein the at least one thin-film circuit element includes a variable-capacity thin-film capacitor, a first thin-film resistor, a second thin-film resistor, and a thin-film capacitor,
wherein the variable-capacity thin-film capacitor is connected in series between the first and second electrodes,
wherein the first thin-film resistor has a first end connected to the third electrode,
wherein the second thin-film resistor has a first end connected to the fourth electrode, and
wherein second ends of the first and second thin-film resistors are connected to two ends of the thin-film capacitor, respectively, such that the thin-film capacitor is connected between the second ends of the first and second thin-film resistors.

11. The ESD-protective-function-equipped composite electronic component according to claim 1, wherein the plurality of electrodes each comprise an extended electrode disposed on the respective first semiconductor layer and an outer electrode disposed on the extended electrode.

12. An ESD-protective-function-equipped composite electronic component comprising:
a substrate;
first, second and third electrodes;
first, second and third pn junction Zener diodes that each including a first semiconductor layer and a second semiconductor layer disposed on the substrate, wherein the first semiconductors of the first, second and third pn junction Zener diodes are respectively connected to the first, second and third electrodes and the second semiconductors are connected to each other; and
first and second thin-film circuit elements connected in series between a pair of the electrodes.

13. The ESD-protective-function-equipped composite electronic component according to claim 12, wherein the electrode not included in the pair of electrodes is connected to a node between the first and second thin-film circuit elements.

14. The ESD protective-function-equipped composite electronic component according to claim 12, wherein the second semiconductor layers compose a common semiconductor layer in the first, second and third pn junction Zener diodes.

15. The ESD protective-function-equipped composite electronic component according to claim 14,
wherein the substrate has a first region and a second region that is different from the first region, and
wherein the first and second thin-film circuit elements are disposed on respective portions of the first region and the common second semiconductor layer is disposed on the second region.

16. An ESD protective-function-equipped composite electronic component comprising:
a substrate;
at least three electrodes including a first electrode, a second electrode, and a third electrode;
at least two thin-film circuit elements including a first thin-film circuit element and a second thin-film circuit element that are collectively connected in series between the first and the third electrodes; and
at least three pn junction Zener diodes disposed on the substrate including a first pn junction Zener diode, a second pn junction Zener diode, and a third pn junction Zener diode,
wherein the first and second pn junction diodes are connected in series with each other and in a reverse direction between the first and second electrodes, and
wherein the second and third pn junction diodes are connected in series with each other and in a reverse direction between the second and third outer electrodes.

17. The ESD protective-function-equipped composite electronic component according to claim 16, wherein
each of the at least three pn junction Zener diodes includes:
a first semiconductor layer with an insulating layer disposed between the adjacent first semiconductor layers, and
a second semiconductor layer disposed on the substrate, and
wherein each of the at least three electrodes is connected to a corresponding first semiconductor layer and the second semiconductor layers are connected to each other.

18. The ESD protective composite electronic component according to claim 16, wherein the second semiconductor layers compose a common semiconductor layer for the at least three pn junction Zener diodes.

19. The ESD protective composite electronic component according to claim 18,
wherein the substrate has a first region and a second region that is different from the first region, and
the at least two thin-film circuit element are disposed on respective portions of the first region and the common second semiconductor layer is disposed on the second region.

20. The ESD-protective-function-equipped composite electronic component according to claim 16, wherein the plurality of electrodes each comprise an extended electrode disposed on the respective first semiconductor layer and an outer electrode disposed on the extended electrode.

* * * * *